(12) United States Patent
Bradl et al.

(10) Patent No.: US 8,173,534 B2
(45) Date of Patent: May 8, 2012

(54) METHOD FOR PRODUCING A SEMICONDUCTOR WAFER WITH REAR SIDE IDENTIFICATION

(75) Inventors: Stephan Bradl, Regensburg (DE); Rainer Holmer, Steinach (DE)

(73) Assignee: Infineon Technologies AG, Neubiberg (DE)

( * ) Notice: Subject to any disclaimer, the term of this patent is extended or adjusted under 35 U.S.C. 154(b) by 15 days.

(21) Appl. No.: 13/036,669

(22) Filed: Feb. 28, 2011

(65) Prior Publication Data

US 2011/0147471 A1    Jun. 23, 2011

Related U.S. Application Data

(62) Division of application No. 11/622,290, filed on Jan. 11, 2007, now Pat. No. 7,911,036.

(30) Foreign Application Priority Data

Jan. 11, 2006 (DE) .......... 10 2006 001 601

(51) Int. Cl.
*H01L 21/44* (2006.01)

(52) U.S. Cl. .......... 438/597; 438/598; 438/599; 438/33; 438/106; 257/623; 257/624; 257/E21.122; 257/E21.524

(58) Field of Classification Search .......... 438/597, 438/598, 599, 33, 14, 61, 106; 257/623, 257/624, 628, E21.122, E21.524
See application file for complete search history.

(56) References Cited

U.S. PATENT DOCUMENTS

| 4,510,673 | A | 4/1985 | Shils et al. |
| 5,459,340 | A | 10/1995 | Anderson et al. |
| 5,733,711 | A | 3/1998 | Juengling |
| 5,877,064 | A | 3/1999 | Chang et al. |
| 6,274,395 | B1 | 8/2001 | Weber |
| 6,309,943 | B1 | 10/2001 | Glenn et al. |
| 6,525,410 | B1 | 2/2003 | Gelsomini et al. |
| 7,145,459 | B2 * | 12/2006 | Wu et al. ............ 340/572.1 |
| 7,405,665 | B2 | 7/2008 | Yamazaki |
| 7,485,493 | B2 | 2/2009 | Fuergut et al. |
| 2005/0280503 | A1 | 12/2005 | Lee et al. |
| 2006/0138651 | A1 * | 6/2006 | Walko ............ 257/728 |

FOREIGN PATENT DOCUMENTS

| DE | 10 2004 048 202 | 4/2006 |
| JP | 200501290 | 4/2005 |
| WO | 98/52226 | 11/1998 |
| WO | 03/065576 | 8/2003 |
| WO | 2006/034683 | 4/2006 |

OTHER PUBLICATIONS

Office Action mailed Apr. 21, 2010 for U.S. Appl. No. 11/622,290.

* cited by examiner

*Primary Examiner* — Thinh T Nguyen

(74) *Attorney, Agent, or Firm* — Dicke, Billig & Czaja, PLLC

(57) ABSTRACT

A semiconductor wafer with rear side identification and to a method for producing the same is disclosed. In one embodiment, the rear side identification has a multiplicity of information regarding the monocrystalline and surface and also rear side constitution. A multiplicity of semiconductor device positions arranged in rows and columns are provided on the top side of the semiconductor wafer, an information chip being arranged at an exposed semiconductor device position, the information chip having at least the information of the rear side identification.

12 Claims, 7 Drawing Sheets

METHOD FOR PRODUCING A SEMICONDUCTOR WAFER WITH REAR SIDE IDENTIFICATION

CROSS-REFERENCE TO RELATED APPLICATIONS

This Utility patent application is a divisional application of U.S. application Ser. No. 11/622,290, filed Jan. 11, 2007, which claims priority to German Patent Application No. DE 10 2006 001 601.7 filed on Jan. 11, 2006, which is incorporated herein by reference.

BACKGROUND

The invention relates to a semiconductor wafer with rear side identification having a multiplicity of information regarding the monocrystalline and surface and rear side constitution.

The rear side identification is introduced by the semiconductor wafer manufacturer on the rear side of the semiconductor wafer in order to reserve the top side of the semiconductor wafer for the active components and not to impair it by identification markings. Such identification markings would take up valuable semiconductor surface area and, the high quality of the semiconductor wafer top side reserved for active components can be impaired during the introduction of the marking. Such rear side identifications are introduced by etching technology and/or by laser writing techniques and are intended to make it possible to characterize the specific properties of the individual semiconductor wafers after various monocrystalline crystal growth methods, doping methods and/or after epitaxy methods where epitaxial layers are applied on the active top side by the semiconductor wafer manufacturer.

However, such information is lost during the process of thinning the semiconductor wafers since such thinning operations are effected from the rear side of the semiconductor wafer. However, there is a need to retain this information and additionally to store it and further process data added during the production of semiconductor device structures on the active top side of the semiconductor wafer.

The document U.S. Pat. No. 5,733,711 discloses a method in which both fixedly predefined and variable patterns can be formed independently of one another within a single photoresist layer. It is thus possible to form fixed general alignment marking patterns and a variable identification marking pattern in a single photoresist layer and both patterns are transferred to an underlying substrate by an individual etching process. In this case, each pattern formed is formed independently of the other by application of different reticle masks. The information that can be introduced by patterning of an individual photolithography layer or by etching with the aid of a photoresist mask on the top side of a semiconductor wafer is extremely limited and serves only for identification and/or alignment of the semiconductor wafer in the case of further photoresist layers. A pattern of this type is unable, however, to store information, in particular process information, and provide it for process analyses.

The document Lynn Dwyer et al., "Lithographic Chip Identification: Meeting the Failure Analysis Challenge", SPIE Vol., Proceedings of Integrated Circuit Metrology, Inspection and Process Control IV, 1992, pages 615-629, discloses a method using step-by-step photolithography in which each individual semiconductor chip of a semiconductor wafer is identified in order to enable a subsequent fault analysis. A method of this type is complicated and takes up an additional region in which the identification is arranged for each semiconductor chip of a semiconductor wafer. This semiconductor chip marking is neither provided nor suitable for storing process information. Furthermore, there is also no provision made for preserving the rear side identification of the semiconductor wafer prior to destruction.

For these and other reasons, there is a need for the present invention.

SUMMARY

One embodiment provides a semiconductor wafer with rear side identification and to a method for producing the same. In one embodiment, the rear side identification has a multiplicity of information regarding the monocrystalline and surface and also rear side constitution. A multiplicity of semiconductor device positions arranged in rows and columns are provided on the top side of the semiconductor wafer, an information chip being arranged at an exposed semiconductor device position, the information chip having at least the information of the rear side identification.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
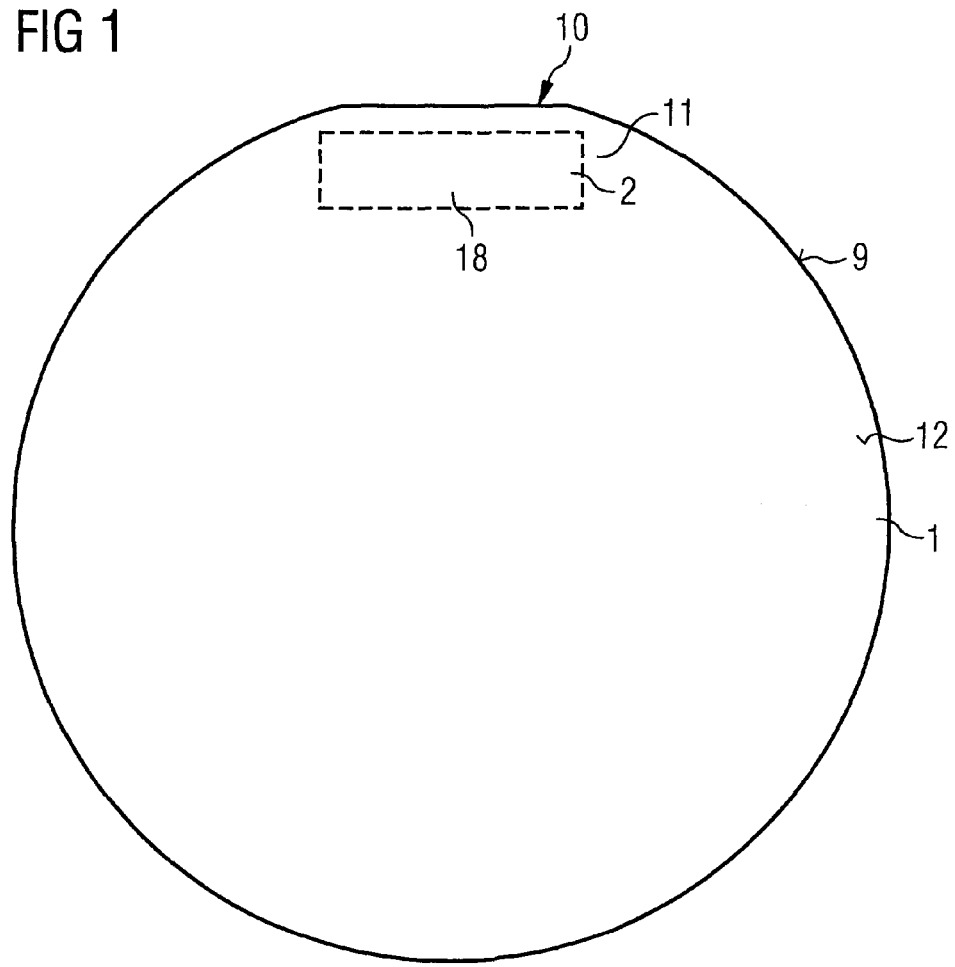
FIG. 1 illustrates a schematic bottom view of the rear side of a semiconductor wafer.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the invention provides a possibility for storing in retrievable fashion both the information contained in a rear side identification of a semiconductor wafer and the process data applied up to the thinning of the semiconductor wafer.

In one embodiment a semiconductor wafer is provided with rear side identification having a multiplicity of information regarding the monocrystalline and surface and also rear side constitution, in which the top side has a multiplicity of semiconductor chip positions arranged in rows and columns. In this embodiment an information chip is arranged at an exposed semiconductor chip position, the information chip having at least the information of the rear side identification.

With a semiconductor wafer of this type, it is possible, without any loss of information, to dispense with the rear side identification or, still prior to thinning of the semiconductor wafer, to store all information contained in the rear side identification in the information chip that has already been completed by then. This makes use of the fact that prior to the thinning of a semiconductor wafer, all the semiconductor device positions on the active top side of the semiconductor wafer already have fully functional semiconductor chips which already bear the upper metallization as well, so that, for the purpose of storing the rear side identification on the active top side of the information chip equipped with memory cells, the memory cells of the information chip can be furnished with the rear side identification.

Furthermore, all process data that have led to semiconductor chips in the semiconductor device positions during the patterning of the semiconductor wafer can likewise be stored in the information chip. Finally, it is possible, during the separation of the semiconductor wafer into individual semiconductor chips and the subsequent assembly to form individual semiconductor components, simultaneously to assemble the information chip to form an information component, so that, for a production batch, it is practically possible to concomitantly supply a log component having the information chip that has stored all the production data.

In one embodiment of the invention, the periphery of the semiconductor wafer has at least one marking in the form of a cutout, the exposed semiconductor wafer position with the information chip being arranged in the edge region of the semiconductor wafer adjacent to the marking. Such markings in the form of cutouts are concomitantly supplied by the manufacturer in order to identify the crystallographic alignment and orientation of the monocrystalline semiconductor wafer. Moreover, the marking is used to provide the rear side identification at a predefined location on the rear side, so that it is possible to rapidly access this location with the rear side identification.

In one embodiment of the invention, the semiconductor wafer is a semiconductor wafer which is thinned from its rear side and whose rear side identification is no longer present.

On account of the information chip provided on the active top side of the semiconductor wafer, it is possible to dispense with the rear side identification at the instant at which the information chip in the exposed semiconductor device position is functional.

The information chip has an oxide layer structure and/or metal wiring structure which enables an optical evaluation. Such a patterned oxide layer structure and/or metal wiring structure has the advantage that the information chip not only serves for information storage but can also be used for optical alignment purposes.

It is furthermore provided that the information chip has a metal wiring structure with contact areas via which stored semiconductor wafer data can be retrieved or read with the aid of measuring probes or measuring tips. This embodiment presupposes, as already discussed above, that the information chip is formed in fully functional fashion before the rear side identification on the rear side is removed by thinning, for example. Moreover, the information chip presupposes that the upper metallization of the top side of the semiconductor wafer is terminated with the contact areas in the semiconductor chip positions.

The information chip has an "ID tag" based on a "low cost chip card" product. The latter has the advantage that it is possible to have recourse to the rear side identification for the layout of the information chip, as is known for the "low cost chip card" products. The information chip has identification and wafer process information of a wafer production batch. The identification and wafer process information is associated with the advantage that it becomes possible to effect a complete analysis of a production batch after the completion of the semiconductor chips. Thus, as already mentioned above, it is possible to assemble the information chip to form a log semiconductor device in order to enable an automatic analysis.

In a further embodiment of the invention, the metallization structure of the semiconductor wafer has in the edge region coupling structures, which are electrically connected to the information chip, for a contactless electrical coupling. Such a contactless electrical coupling can be produced via capacitively coupling metal areas or via an inductively coupling induction loop or, finally, via an antenna structure for electromagnetic coupling. This has one advantage in that the information is read out optically and contactlessly by means of auxiliary structures rather than by a large-area bar code laser, which auxiliary structures can be introduced during the patterning of the last metallization layer of the semiconductor wafer, and contactless coupling to corresponding sensors is possible.

Although a direct ohmic contact-connection via the contact areas of the information chip is still possible, a fast and reliable data exchange between the information chip and the analysis apparatuses can be produced by means of the capacitive or electromagnetic coupling. Furthermore, the coupling structures have one advantage in that they cannot be damaged by mechanical contact. The capacitive coupling and also the induction loop coupling have the advantage that special mask sets are not required for the production of the capacitive area or for the production of the induction loop, since the entire semiconductor wafer is metallized in the last metallization process, and it is possible to use a patterning mask which completely maintains the metallization in the edge region of the semiconductor wafer. Only short conductor tracks are required for connecting the induction loop arranged on the periphery of the wafer or the capacitive metallic coupling area arranged on the periphery of the wafer, in order to electrically connect the information chip to these coupling elements.

A method for producing a semiconductor wafer with an identification, firstly a rear side identification having a multiplicity of information regarding the monocrystalline and surface and also rear side constitution of the semiconductor wafer being arranged on the rear side of the semiconductor wafer is provided. The method includes the following processes:

The first process involves introducing a multiplicity of semiconductor chip structures in semiconductor device positions in rows and columns on the top side of the semiconductor wafer. At the same time, an information chip structure is introduced in an exposed semiconductor device position on the top side of the semiconductor wafer. After completion of the multiplicity of semiconductor chip structures and the information chip structure in an exposed semiconductor device position, semiconductor identification data of the rear side identification and information of semiconductor processes of a production batch are stored in the information chip.

Afterward, the semiconductor wafer identification and the semiconductor process information of a production batch that are stored in the information chip can be retrieved as required, in particular after thinning of the semiconductor wafer from its rear side.

This method has one advantage in that a semiconductor wafer is produced which, despite thinning, stores all information recorded in the rear side identification and all semiconductor process information in an information chip specifically provided therefor. Moreover, the method has an advantage that the rear side information is not lost despite thinning of the semiconductor wafer, but rather can be transferred to the active top side prior to thinning.

One exemplary implementation of the method provides for the information chip to be introduced into the structure of the top side of the semiconductor wafer at the exposed position by a "shared reticle" set. The use of a "shared reticle" set makes it possible, by the masks and reticles provided for the rest of the semiconductor device positions, simultaneously to pattern the information chip and prepare it for recording the process information and also the information of the rear side identification of the semiconductor wafer to an extent such that the rear side information can be transferred to the active top side of the semiconductor wafer directly prior to thinning.

Furthermore, the method includes preparatory method processes in order, by way of example, to provide a marking in the form of a cutout on the periphery of the semiconductor wafer. For this purpose, at least one marking in the form of a cutout is introduced into the lateral surface of a monocrystalline silicon rod parallel to the rod axis before the silicon rod is separated into individual semiconductor wafers.

This preparatory process can ensure that the orientation of the monocrystalline silicon rod is ensured by the positioning and type of embodiment of the cutout at the periphery of the semiconductor wafer for all the semiconductor wafers which are worked from one and the same rod. For this purpose, after the separation of the rod into individual semiconductor wafers, the rear side of each semiconductor wafer is provided with the rear side identification in order to document the information regarding the monocrystalline and surface and also rear side constitution of the semiconductor wafer.

In a further exemplary implementation of the method, the semiconductor wafer is thinned from its rear side after the patterning of the semiconductor device positions and hence also the patterning of the information chip have been concluded on its active top side. For this purpose, the rear side identification is removed during thinning only when the information contained there has been stored in the information chip on the top side of the semiconductor wafer.

A further exemplary implementation of the method provides for the information chip to be provided with an oxide layer structure and/or metal wiring structure which enables an optical evaluation. Such an evaluation may concern an identification, an interrogation of method parameters and/or an alignment aid, which has the advantage that a contactless optical evaluation of the information data of the information chip is possible.

On the other hand, it is also possible for a metal wiring structure with contact areas via which semiconductor wafer data stored in the information chip can be retrieved or read is applied to the information chip.

Furthermore, it is possible to use the contact areas to accommodate an information chip in a semiconductor element housing by means of corresponding connecting elements. This gives rise to a semiconductor element which is available as a log device which has stored, for a production batch of a semiconductor wafer, all the process data including the rear side identification of the semiconductor wafer.

Furthermore, an "ID tag" based on a "low cost chip card" product may be introduced into the information chip. The advantages associated with this have already been discussed above and will not repeated again at this juncture. In order to be able to retrieve the information after the thinning of the semiconductor wafer, identification and wafer process information of a wafer production batch is stored in the information chip. The advantages of such a storage operation are huge compared with conventional techniques since arbitrarily detailed information and data can be stored in the information chip and is available in retrievable fashion at any time for an analysis and evaluation.

Furthermore, coupling structures for contactless electrical connections toward the information chip are introduced into the metallization structure in the edge region of the semiconductor wafer. The coupling structures may include an induction loop serving for an inductive coupling. A capacitive coupling may be introduced into the metallization structure of the information chip by means of a metal area. Finally, it is also possible to electrically connect antenna structures to the information chip, thereby enabling a connection between information chip and external evaluation by means of electromagnetic coupling.

To summarize, it can be stated that for the competitiveness of a product, primarily the reliability and quality of the product supplied are crucial and decisive in addition to the optimum customized solution for the customer. For this purpose, comprehensive measurements and statistical cross-correlations are carried out in order to plumb meaningful process parameters and in order to establish in terms of price and qualitatively the optimum production process for semiconductor wafers. This is inextricably linked with the requirement to know an identity of the semiconductor wafer currently being processed at any point in time and at any location in order thereby to be able to make unambiguous assignments with regard to the individual process parameters.

Rising cost pressure and the increasing requirements made of device quality with regard to performance and reliability furthermore force the manufacturers of integrated circuits to implement evermore efficient and higher-quality production methods. Besides reducing the device size, attention is primarily focused on utilizing the wafer geometry as efficiently as possible in order to stay competitive from the standpoint of costs. With respect to the wafer, an improved edge reduction is sought and an increase in the wafer diameter is proposed in order to reduce the production costs. On the other hand, however, there is the need for an unambiguous semiconductor wafer marking, because only that ensures the correct assignment of process and process sequences to the respective semiconductor product in an automated production process.

Present-day technology employs barcodes and plain text inscription both on the top side of the wafer and on the underside of the wafer. The space required for this is an impediment, however, to utilization of the area of the semiconductor wafer. This disadvantage is now eliminated, however, by means of the solution according to the invention, so that a semiconductor wafer is available in which no prior information whatsoever is lost and the area requirement is nevertheless reduced to the size of a semiconductor chip position.

For this purpose, at the beginning of wafer production, a rear side identification of the semiconductor wafers is burned in onto the rear side, for example by laser markings This actually makes it possible in the first place to effect the individual semiconductor wafer characterization or process tracking and analysis. By virtue of the rear side identification, the wafer top side remains entirely unaffected by this marking and can accordingly be concomitantly used for the construction of semiconductor chips.

In the context of semiconductor chip construction, an ID tag on the basis of a "low cost chip card" product is positioned and constructed at an exposed location on the semiconductor wafer by means of a "shared reticle" set. At the latest after the first metallization level, the ID tag can have the associated information written to it and subsequently be used as semiconductor wafer identification.

Subsequent processes, such as e.g., the modification and alteration of the wafer rear side, as effected during wafer thinning or during rear side metallization, can now be carried out in a manner unimpaired by the former barcode marking, since, at this point in time, the associated semiconductor wafer identification is already situated on the top side of the semiconductor wafer in the information chip.

What can be regarded as another advantage of the novel semiconductor wafer and of the method for producing it is the fact that in the information chip, in a manner limited solely by its storage capacity, all relevant process parameters for an individual production batch or for the associated semiconductor wafer can be established in detailed fashion and are immediately and directly available for further process controls or process analyses. Even splittings and process variations within a batch can be tracked and controlled with the aid of the information chip. Furthermore, the use of the information chip also opens up, of course, far-reaching possibilities for rapid and contactless semiconductor wafer identification which can be used for optimizing production if corresponding coupling elements are provided on the semiconductor wafer in conjunction with the information chip.

FIG. 1 illustrates a schematic bottom view of the rear side 12 of a semiconductor wafer 1. The semiconductor wafer 1 has a cutout 10 for marking the crystal orientation of the monocrystalline silicon material at its periphery 9. In the vicinity of the cutout 10, a marking 18 is arranged in the edge region 11 of the semiconductor wafer, the marking having a multiplicity of information regarding the monocrystalline and surface and also rear side constitution. The rear side identification 2 is applied by the manufacturer of the semiconductor wafer 1 and may be introduced either by a selective etching technique or by laser removal.

Figure 2:
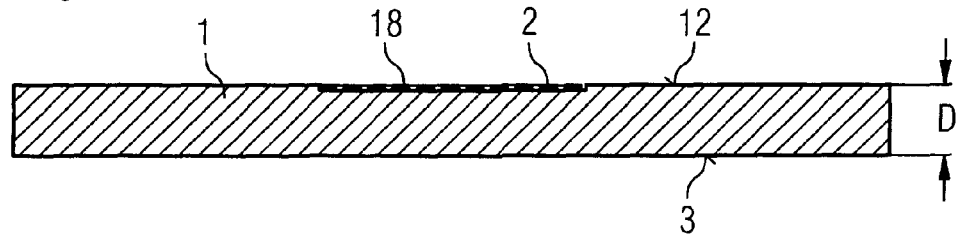
FIG. 2 illustrates a schematic cross section through the semiconductor wafer from FIG. 1.

FIG. 2 illustrates a schematic cross section through the semiconductor wafer from FIG. 1. Components having functions identical to those in FIG. 1 are identified by the same reference symbols and are not explained separately. In FIG. 2, the semiconductor wafer 1 still has its complete thickness D, which is between 400 µm and 800 µm in the case of an 8 inch wafer.

The position of the rear side identification 2 or the rear side marking 18 is indicated by a dashed line on the rear side 12. While the rear side identification 2 is arranged on the rear side 12, the active top side 3 of the semiconductor wafer 1 is mirror-polished and has no markings whatsoever. Monocrystalline epitaxial layers may already be applied on the top side 3, and their specification may likewise be impressed in the rear side identification 2.

Figure 3:
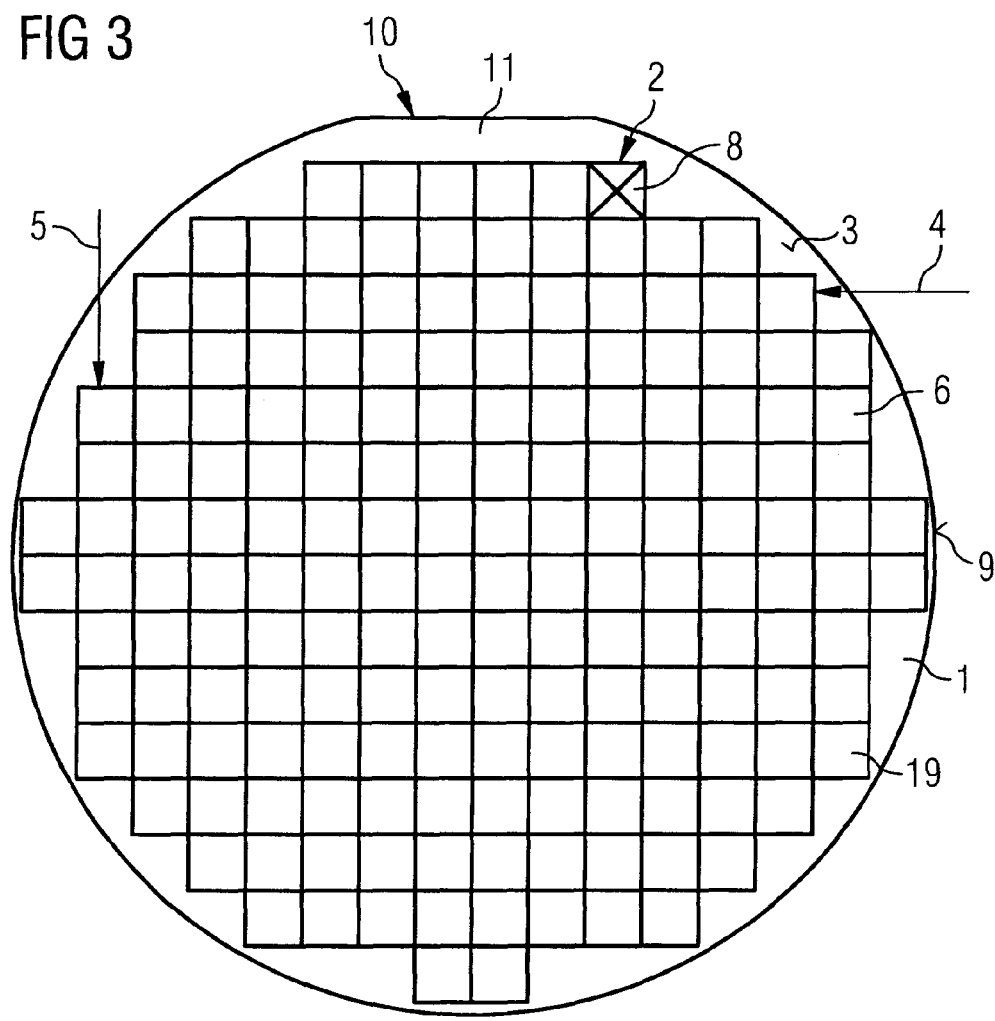
FIG. 3 illustrates a schematic plan view of the top side of a semiconductor wafer after the application of semiconductor chip structures.

FIG. 3 illustrates a schematic plan view of the top side 3 of the semiconductor wafer 1 in accordance with FIG. 2 after the introduction or application of semiconductor chip structures 19. The semiconductor chip structures 19 are arranged in rows 4 and columns 5 in semiconductor device positions 6. In an exposed semiconductor device position 7 in the vicinity of the cutout 10, the structure of an information chip 8 is applied to the top side 3 of the semiconductor wafer 1.

The information chip 8 has an oxide structure and a metal wiring structure which enables an optical evaluation. Furthermore, the metal wiring structure has contact areas via which stored semiconductor wafer data can be retrieved and read out. Finally, not only the rear side identification but also wafer process information of a wafer production batch is stored in the information chip.

Figure 4:
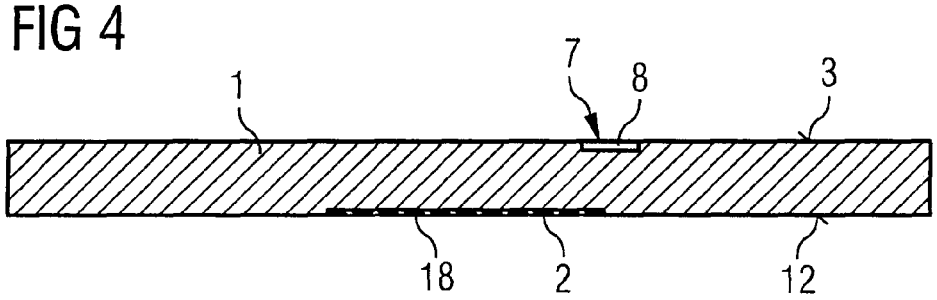
FIG. 4 illustrates a schematic cross section through the semiconductor wafer from FIG. 3.

FIG. 4 illustrates a schematic cross section through the semiconductor wafer 1 in accordance with FIG. 3. The cross section illustrates, in particular, on the top side 3, the exposed semiconductor device position 7 of the information chip 8 in relation to the rear side identification arranged on the underside 12. In this state of the semiconductor wafer 1, the entire information contained in the rear side identification 2 is already stored in the information chip 8 on the active top side 3 of the semiconductor wafer 1.

Figure 5:
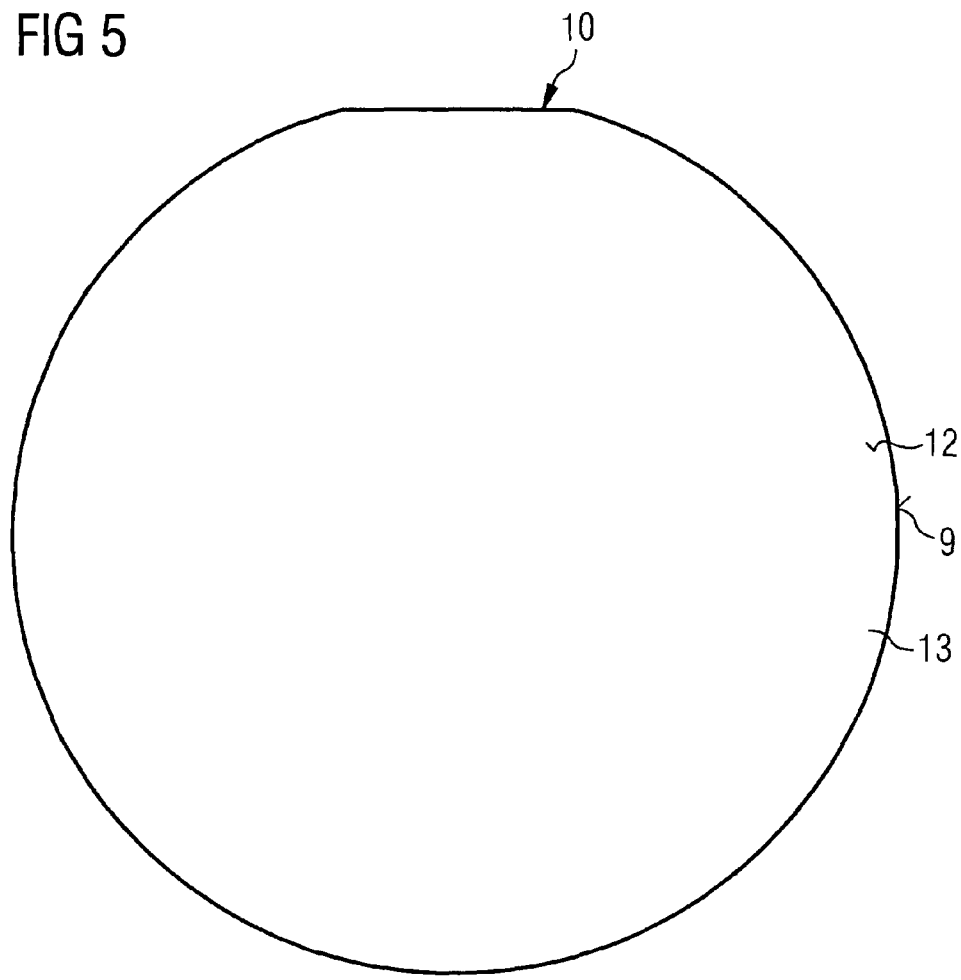
FIG. 5 illustrates a schematic bottom view after the thinning of the semiconductor wafer from FIG. 4.

FIG. 5 illustrates a schematic bottom view after the thinning of the semiconductor wafer from FIG. 4. The thinning gives rise to the thinned semiconductor wafer 13, which no longer has a rear side identification on its rear side 12 since the thinning is effected from the rear side. Only the cutout 10 for orientation of the mono crystalline semiconductor silicon wafer is still present and facilitates finding the exposed semiconductor device position with the information chip.

Figure 6:
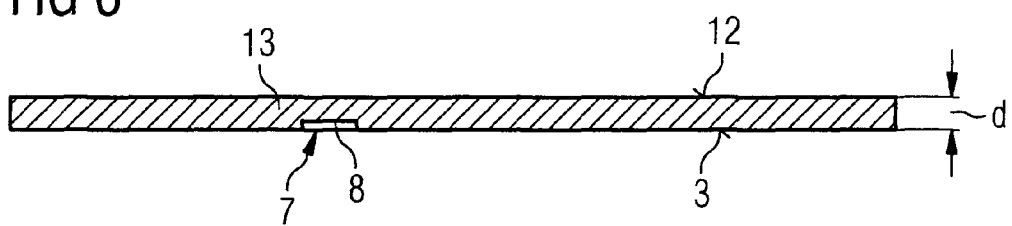
FIG. 6 illustrates a schematic cross section through the semiconductor wafer in accordance with FIG. 5.

FIG. 6 illustrates a schematic cross section through the thinned semiconductor wafer 13 in accordance with FIG. 5, which now has a thickness d in micrometers of between 50 and 250 µm. In this case, the top side 3 with the semiconductor chip structures remains unchanged, so that the information chip 8 with stored data of the rear side identification is also situated there.

Figure 7:
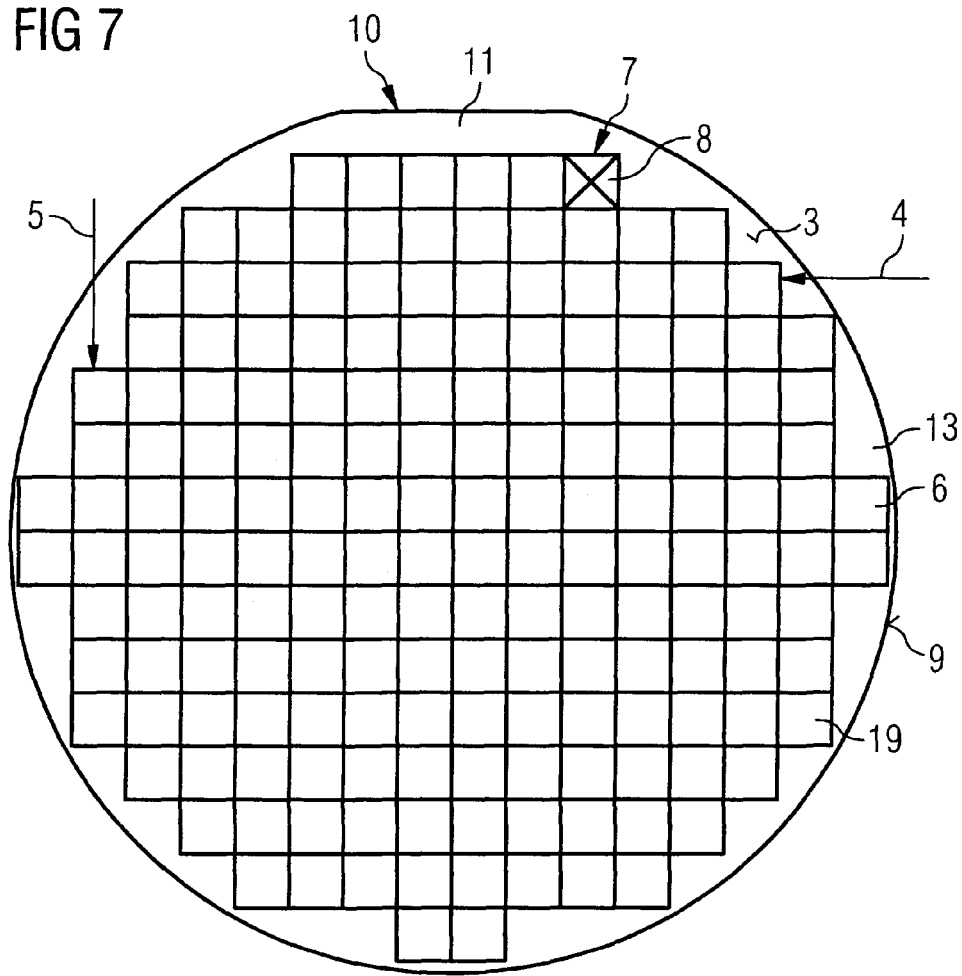
FIG. 7 illustrates a schematic plan view of the semiconductor wafer in accordance with FIG. 6.

FIG. 7 illustrates a schematic plan view of the thinned semiconductor wafer 13 in accordance with FIG. 6. The top side 3 corresponds fully to the top side 3 in accordance with FIG. 3, components having functions identical to those in FIG. 3 being identified by the same reference symbols and not being discussed separately.

Figure 8:
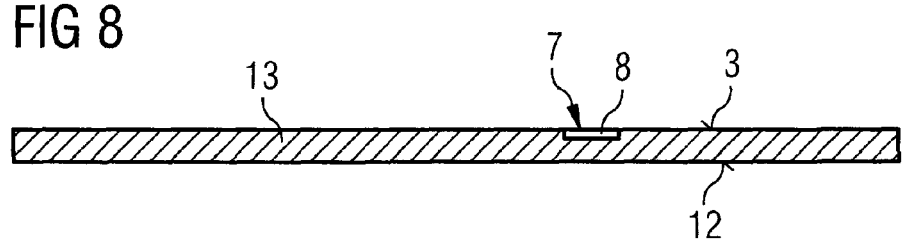
FIG. 8 illustrates a schematic cross section through the semiconductor wafer in accordance with FIG. 7.

FIG. 8 illustrates a schematic cross section through the thinned semiconductor wafer 13 in accordance with FIG. 7, the top side 3 now also being arranged diagrammatically in the normal processing position.

Figure 9A:
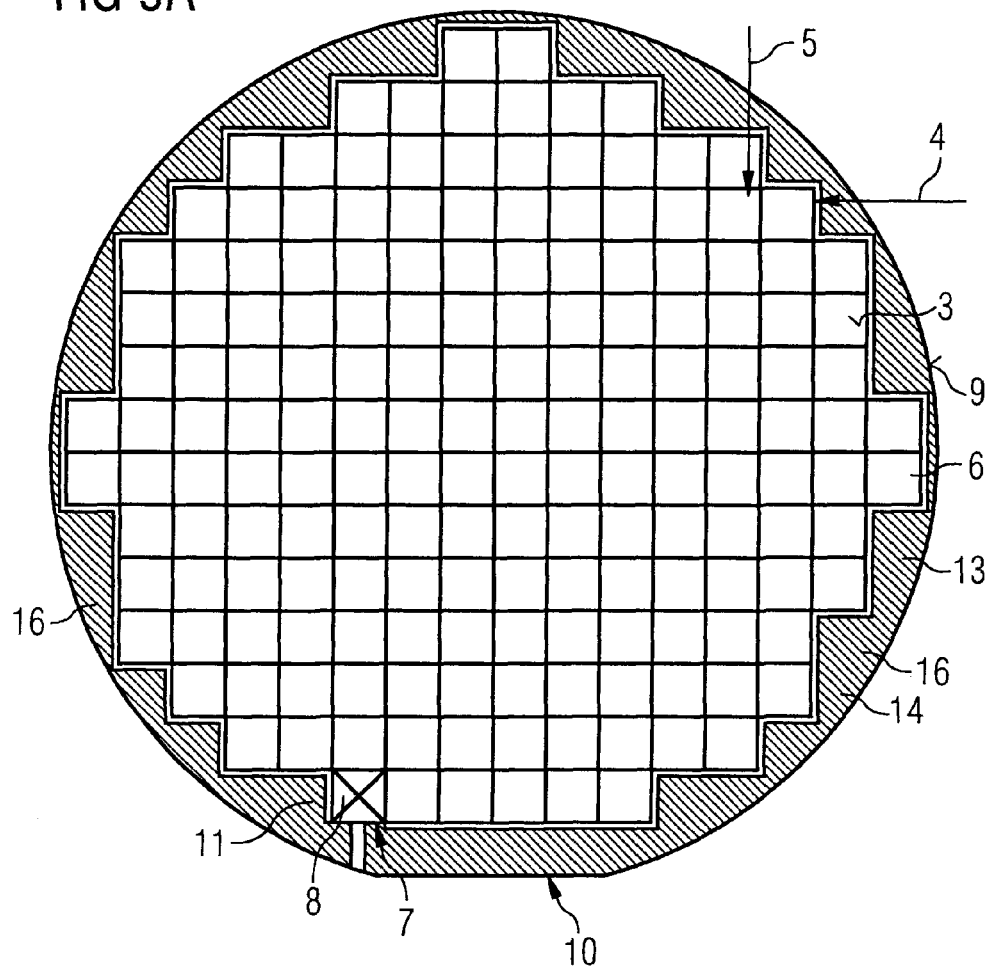
FIGS. 9a and 9b illustrate basic schematic diagrams of a thinned semiconductor wafer with edge metallization for the capacitive coupling of the information chip.
Figure 9B:
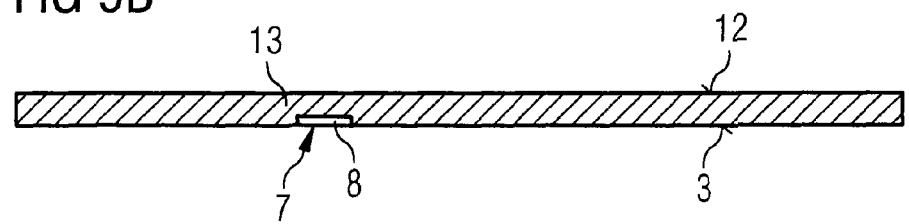

FIGS. 9a and 9b illustrate basic schematic diagrams of a thinned semiconductor wafer 13 with edge metallizations as coupling structure 14 for the capacitive coupling of the information chip 8 for corresponding measuring and evaluation apparatuses. For this purpose, FIG. 9a illustrates a plan view of the top side 3 and FIG. 9b illustrates a cross section through the thinned semiconductor wafer 13. The capacitively coupling metal area 16 may be arranged on the semiconductor wafer 13 in the edge region without additional area requirement. It arises practically during the last or upper metallization of the semiconductor wafer 13 by virtue of the metallization layer not being removed in the edge region 11 of the semiconductor wafer 13.

While the metal area 16 in the edge region of the semiconductor wafer is spaced apart from the individual semiconductor chip structures 19, the metal area 16 makes contact with the information chip 8 in order to enable a signal exchange via capacitive coupling with the information chip. If the metal area 16 in the edge region 11 of the semiconductor wafer 13 is divided in the region of the information chip 8, then the edge metallization may also be connected to the information chip 8 as an induction loop. Moreover, the edge metallization may also serve as an antenna structure in order to read out stored information from the information chip in the case of electromagnetic coupling.

Figure 10A:
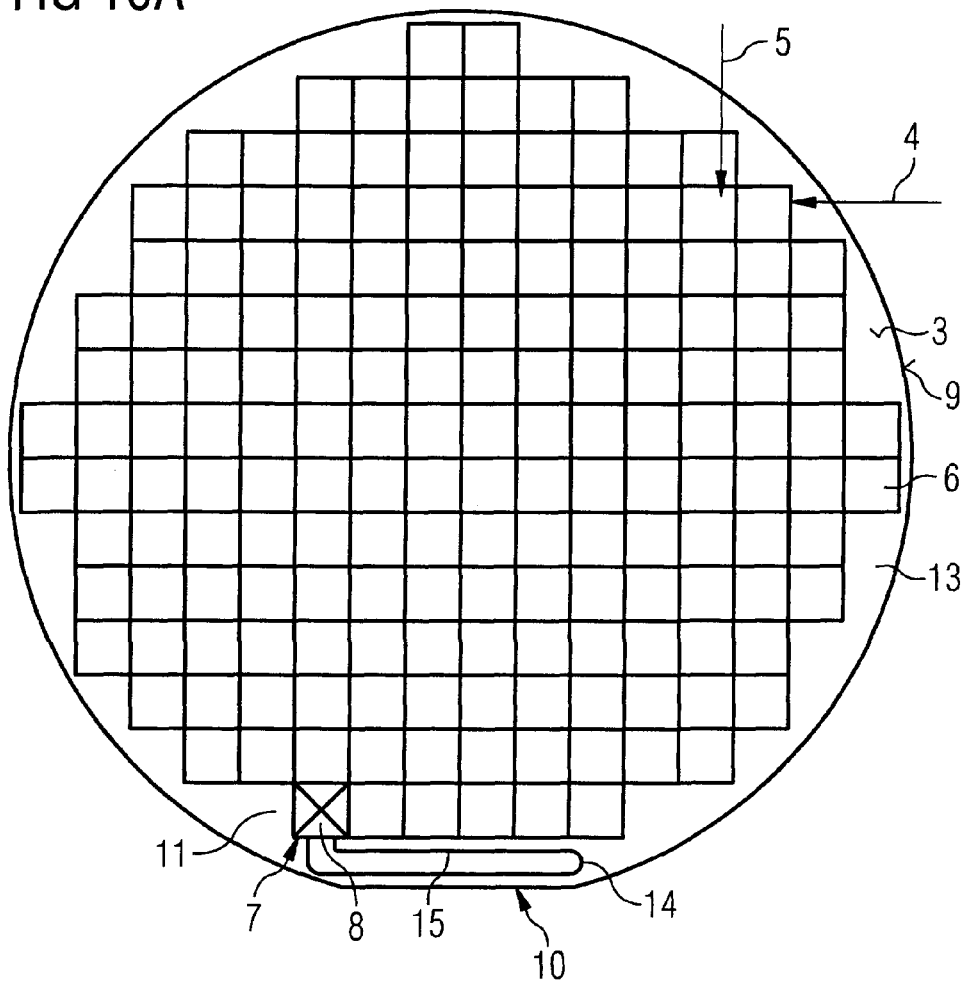
FIGS. 10a and 10b illustrate basic schematic diagrams of a thinned semiconductor wafer with an induction loop for the inductive coupling of the information chip.
Figure 10B:
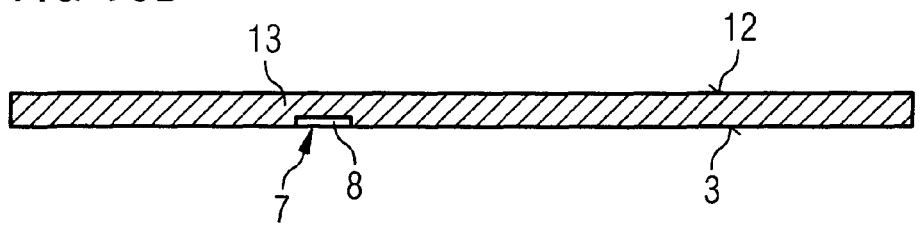

FIGS. 10a and 10b illustrate basic schematic diagrams of a thinned semiconductor wafer 13 with an induction loop 15 for the inductive coupling of the information chip 8. In this case, an induction loop 15 is realized which is arranged in the edge region 11 adjacent to the cutout 10 on the periphery 9 of the semiconductor wafer 13 and is electrically connected to the information chip 8.

Figure 11A:
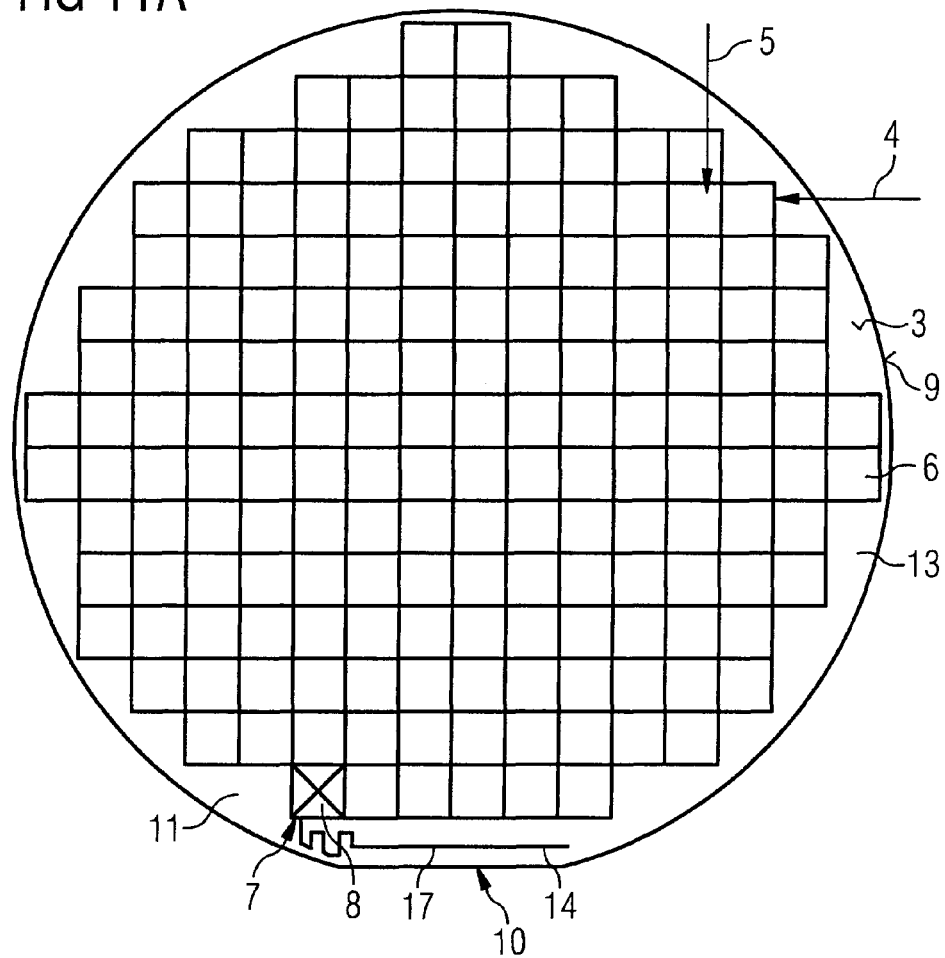
FIGS. 11a and 11b illustrate basic schematic diagrams of a thinned semiconductor wafer with an antenna structure for the electromagnetic coupling of the information chip.
Figure 11B:
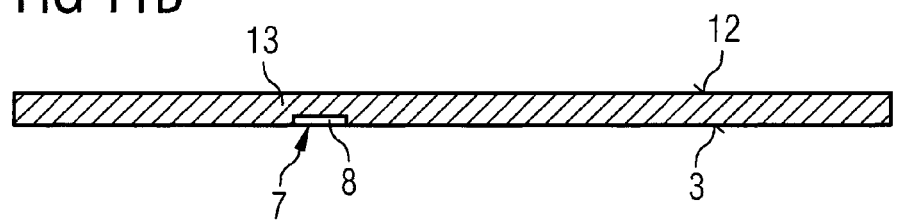

FIGS. 11a and 11b illustrate basic schematic diagrams of a thinned semiconductor wafer 13 with an antenna structure 17 for the electromagnetic coupling of the information chip 8. In this embodiment of the invention, a rod antenna as antenna structure 17 is arranged in the edge region t of the thinned semiconductor wafer 13 adjacent to the cutout 10 on the periphery 9 of the semiconductor wafer 13. The rod antenna is electrically connected to the information chip 8, so that stored information of the information chip 8 can be retrieved contactlessly via the antenna structure 17. In the embodiments of FIGS. 9 to 11, the stored information can be fed contactlessly to an evaluation circuit.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor wafer with a rear side identification having a multiplicity of information regarding the monocrystalline, surface and rear side constitution of the semiconductor wafer being arranged on the rear side of the semiconductor wafer, the method comprising:

introducing a multiplicity of semiconductor chip structures in semiconductor chip positions which are arranged in rows and columns on the top side of the semiconductor wafer;

introducing an information chip structure in an exposed semiconductor chip position of the top side of the semiconductor wafer;

storing semiconductor identification data of the rear side identification and semiconductor process information of a production batch in the information chip of the information structure; and retrieving the semiconductor wafer identification and the semiconductor process information of a production batch stored in the information chip as required, after a thinning of the semiconductor wafer from its rear side.

2. The method as claimed in claim 1, comprising introducing the information chip into the structure of the top side of the semiconductor wafer at the exposed position by a "shared reticle" set.

3. The method as claimed in claim 1, comprising introducing at least one marking in the form of a cutout into the lateral surface of a monocrystalline silicon rod parallel to the rod axis before the silicon rod is separated into semiconductor wafers.

4. The method as claimed in claim 1, comprising thinning the semiconductor wafer from its rear side, its rear side identification being removed.

5. The method as claimed in claim 1, comprising providing the information chip with an oxide layer structure and/or a metal wiring structure which enables an optical evaluation.

6. The method as claimed in claim 1, comprising applying a metal wiring structure with contact areas via which semiconductor wafer data stored in the information chip can be retrieved or read to the information chip.

7. The method as claimed in claim 1, comprising introducing an "ID tag" based on a "low cost chip card" product into the information chip.

8. The method as claimed in claim 1, comprising storing identification and wafer process information of a wafer production batch in the information chip.

9. The method as claimed in claim 1, comprising introducing coupling structures for contactless electrical connections to the information chip into the metallization structure of the semiconductor wafer in the edge region.

10. The method as claimed in claim 9, comprising wherein as coupling structure electrically connected to the information chip, introducing an induction loop for inductive coupling into the metallization in the edge region of the semiconductor wafer.

11. The method as claimed in claim 9, comprising wherein for capacitive coupling, introducing a metal area into the metallization structure of the information chip.

12. The method as claimed in claim 9, comprising introducing an antenna structure, which is electrically connected to the information chip, into the metallization structure in the edge region of the semiconductor wafer for electromagnetic coupling.

* * * * *